United States Patent
Choy et al.

(10) Patent No.: US 8,842,469 B2
(45) Date of Patent: Sep. 23, 2014

(54) METHOD FOR PROGRAMMING A MULTI-STATE NON-VOLATILE MEMORY (NVM)

(75) Inventors: Jon S. Choy, Austin, TX (US); Chen He, Austin, TX (US); Michael A. Sadd, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 988 days.

(21) Appl. No.: 12/942,285

(22) Filed: Nov. 9, 2010

(65) Prior Publication Data
US 2012/0113714 A1    May 10, 2012

(51) Int. Cl.
G11C 16/10        (2006.01)
G11C 11/56        (2006.01)

(52) U.S. Cl.
CPC ............ *G11C 16/10* (2013.01); *G11C 11/5628* (2013.01)
USPC .................................. 365/185.03; 365/185.19

(58) Field of Classification Search
USPC ........................................ 365/185.03, 185.19
See application file for complete search history.

(56) References Cited

U.S. PATENT DOCUMENTS

| | | | |
|---|---|---|---|
| 6,654,287 B2 | 11/2003 | Visconti | |
| 6,735,727 B1 * | 5/2004 | Lee | 714/711 |
| 7,173,859 B2 | 2/2007 | Hemink | |
| 7,177,199 B2 * | 2/2007 | Chen et al. | 365/185.28 |
| 7,239,557 B2 * | 7/2007 | Ha | 365/185.33 |
| 7,453,731 B2 * | 11/2008 | Tu et al. | 365/185.18 |
| 7,633,804 B2 * | 12/2009 | Nobunaga | 365/185.19 |
| 7,872,926 B2 * | 1/2011 | Blodgett | 365/189.05 |

* cited by examiner

*Primary Examiner* — Harry W Byrne
*Assistant Examiner* — Lance Reidlinger
(74) *Attorney, Agent, or Firm* — James L. Clingan, Jr.; Daniel D. Hill

(57) ABSTRACT

A method is provided for programming a multi-state flash memory having a plurality of memory cells. A first programming pulse is provided to the flash array; determining a threshold voltage distribution for the plurality of memory cells after providing the first programming pulse. The plurality of memory cells is categorized into at least two bins based on a threshold voltage of each memory cell of the plurality of memory cells. A first voltage is selected for a second programming pulse for programming a first bin of memory cells of the at least two bins, the first voltage based on both a threshold voltage of the first bin and a first target threshold voltage. A second voltage is selected for a third programming pulse for programming a second bin of memory cells of the at least two bins, the second voltage based on both the threshold voltage of the second bin and on a second target threshold voltage.

16 Claims, 3 Drawing Sheets

METHOD FOR PROGRAMMING A MULTI-STATE NON-VOLATILE MEMORY (NVM)

BACKGROUND

1. Field

This disclosure relates generally to non-volatile memories (NVMs), and more specifically, to programming multi-state NVMs.

2. Related Art

Multi-state NVMs, in which one memory cell represents more than one bit, provide for efficient use of space and thus are cheaper for a given amount of memory. A multi-state memory in the case of an NVM will have one erased state and multiple programmed states. If there are two programmed states, then there are a total of 3 possible states, two programmed and one erased. If there are three possible programmed states, then there are a total of 4 possible states so that each cell represents 2 bits. One of the issues with multiple programmed states is the amount of time required to achieve the desired programmed states. With sufficient separation in threshold voltage (Vt), programming is a relatively lengthy process even for single-bit cells, but multiple programmed states significantly further complicates the programming process. There must be enough margin to ensure that the various states have threshold voltage distributions sufficiently separated from each other so that they can be read reliably and quickly. So the programming process must result in programmed cells that can be efficiently read.

Accordingly, it is desirable to provide a multi-state NVM that improves upon one or more of issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a non-volatile memory (NVM) provides multi-state programming using hot carrier injection (HCI). The process begins with programming erased cells to an initial condition that results in a threshold voltage (Vt) for each cell that is being programmed and each cell will be suitable for receiving subsequent HCI programming pulses. The NVM cells have Vt's in the initial distribution from which the cells will be further programmed using HCI to a selected one of the multiple programmed states. The NVM cells are divided into bins of Vt ranges. The parameters for the subsequent programming are based on the bin and the particular destination programmed state. This is better understood by reference to the drawings and the following description.

Figure 1:
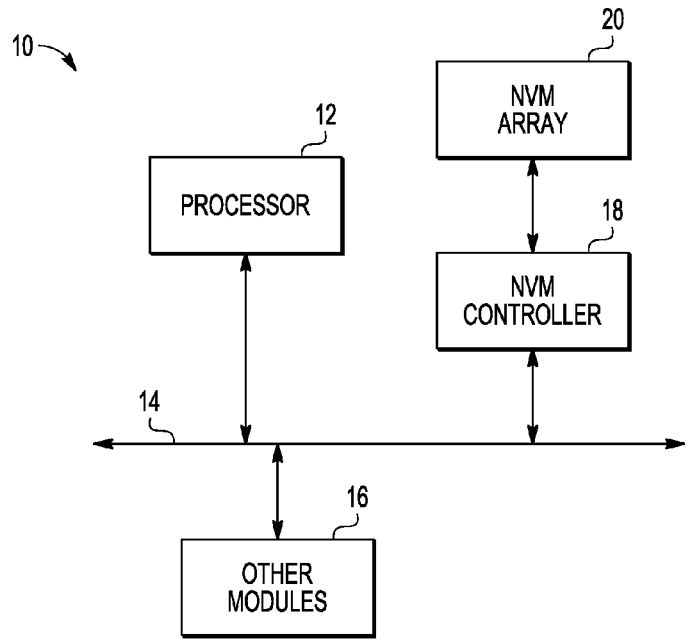
FIG. 1 is a diagram of a system having a multi-state NVM useful in implementing an embodiment.

Shown in FIG. 1 is a system 10 including a processor 12 coupled to a bus 14, other modules 16 coupled to bus 14, an NVM controller 18 coupled to bus 14, and an NVM array 20 coupled to NVM controller 18. The inputs and outputs and bus 14 as shown in FIG. 1 are multi-bit. NVM controller 18 controls operation of NVM array 20. NVM array 20 in this example is a NOR type in which the NVM cells are erased using Fowler-Nordheim (FN) tunneling and programmed using HCI.

Figure 2:
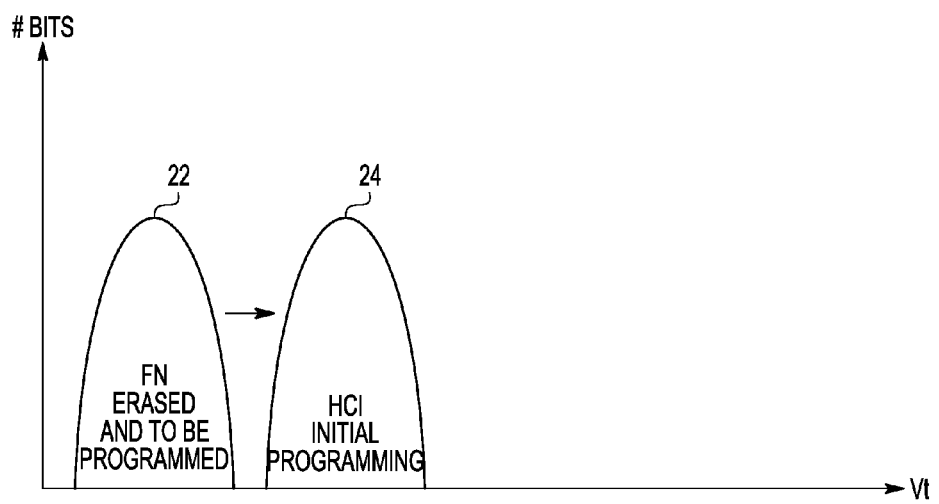
FIG. 2 is a diagram useful in understanding the operation of the system of FIG. 1 regarding programming memory cells in the NVM of the system of FIG. 1.

Shown in FIG. 2 is a distribution 22 of NVM cells of NVM array 20 that have been erased and are to be programmed. One axis is the number of bits (# bits) on a logarithmic scale, and the other axis is threshold voltage (Vt). The NVM cells that are to remain in the erased state are not part of distribution 22 although their distribution would be substantially the same as that of distribution 22. The NVM cells to be programmed and the state to which they are to be programmed is determined by processor 12 and communicated to NVM controller 18 via bus 14. The erasing is performed by NVM controller 18 on NVM array 20 where the NVM cells are resident. NVM array 20 may be a flash memory in which case all of the NVM cells of a selected block are erased in the erasing step. NVM array 20 may be divided into blocks in which case the programming occurs block by block with a selected block being erased followed by the programming steps. After erasing the NVM cells of NVM array 20, an initial program step is performed on the NVM cells to be programmed resulting in a distribution 24 shown in FIG. 2. There is minimal correlation for an individual NVM cell between the NVM cell's location in distribution 22 and its location in distribution 24. An example of the threshold voltage range for distribution 24 is from 2 volts to 4 volts.

Figure 3:
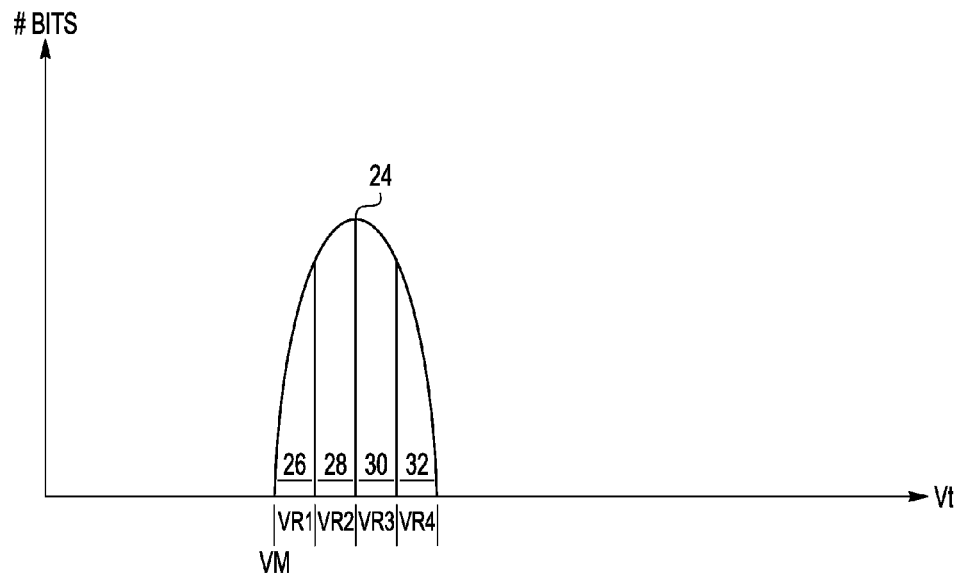
FIG. 3 is a diagram useful in understanding the operation of the system of FIG. 1 regarding programming memory cells in the NVM of the system of FIG. 1 at stage subsequent to that shown in FIG. 2.

Shown in FIG. 3 is distribution 24 divided into four bins, bin 26, bin 28, bin 30, and bin 32. Bin 26 has weakly programmed memory cells that have a Vt in a voltage range VR1. Similarly, bins 28, 30, and 32 have the weakly programmed memory cells that have a Vt in the voltage ranges of VR2, VR3, and VR4, respectively. Voltage ranges VR1, VR2, VR3, and VR4 all have the same magnitude in range and are contiguous in that where VR1 ends, VR2 begins. Similarly, where VR2 ends, VR3 begins, and where VR3 ends, VR4 begins. Voltage range VR1 begins at a minimum voltage VM. Bins 26, 28, 30, and 32 as shown are determined based on where distribution 24 begins and ends assuming that distribution 24 does not span too great of a range. If distribution 24 has a different shape than expected, it may be an indication that NVM array 20 is defective.

Figure 4:
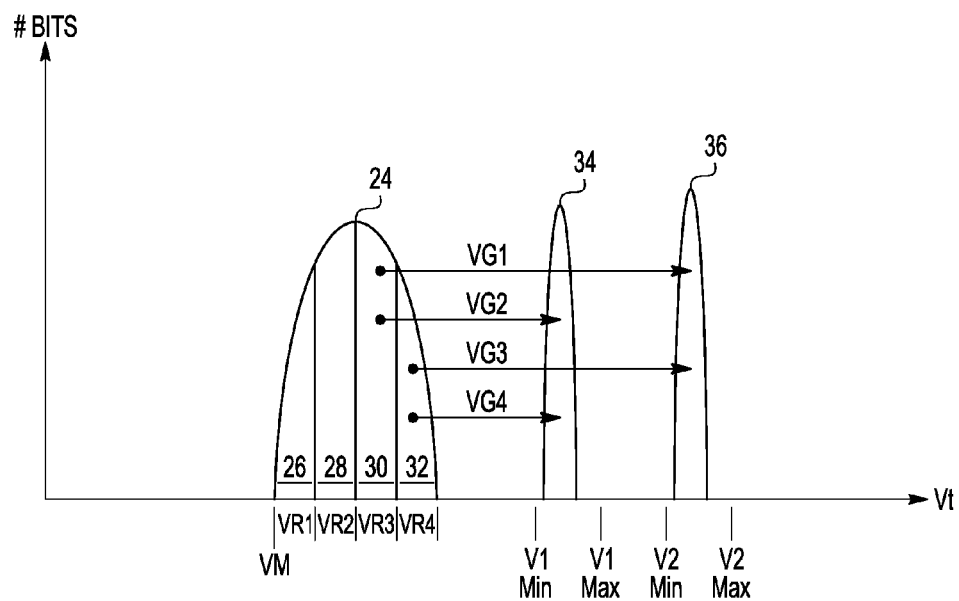
FIG. 4 is a diagram useful in understanding the operation of the system of FIG. 1 regarding programming memory cells in the NVM of the system of FIG. 1 at stage subsequent to that shown in FIG. 3.

Shown in FIG. 4 is a distribution 34 and a distribution 36 representing separate programmed states derived from programming steps applied to distribution 24. Distribution 34 has a threshold distribution between a voltage V1min and a voltage V1max. As an example, V1min may be 5 volts and V1max may be 5.5 volts. The NVM cells programmed to be in distribution 34 may be considered to be programmed state V1. Similarly, distribution 36 has a threshold voltage between a voltage V2min and a voltage V2max. As an example, V2min may be 6 volts, V2max may be 6.5 volts. The NVM cells programmed to be in distribution 36 may be considered to be programmed state V2. Other distributions and corresponding programmed states may also be utilized. All of the cells in each bin 26-32 are programmed by a programming step that is chosen to increase the threshold voltage from that of the particular bin to that of the desired program state. The programming is by HCI. It has been found that the gate voltage in an HCI programming step for the NVM cell can be selected to obtain the desired increase in Vt. For example as shown in FIG. 4, memory cells in bin 30 receive an HCI programming pulse in which a voltage VG1 is applied to the gates of the NVM cells for the purpose of increasing the threshold voltage from the range of VR3 to the range of programming state V2. Similarly, memory cells in bin 30 receive an HCI programming pulse in which a voltage VG2 is applied to the gates of the NVM cells for the purpose of increasing the threshold voltage from the range of VR3 to the range of programming state V1. As shown in FIG. 4, the same approach is applied to bin 32. Memory cells in bin 32 receive an HCI programming pulse in which a voltage VG3 is applied to the gates of the NVM cells for the purpose of increasing the threshold voltage from the range of VR4 to the range of programming state V2. Memory cells in bin 32 receive an HCI programming pulse in which a voltage VG4 is applied to the gates of the NVM cells for the purpose of increasing the threshold voltage from the range of VR4 to the range of programming state V1. Voltage VG4 is less than voltage VG2, and voltage VG3 is less than voltage Vg1. Also VG2 is less than VG1, and VG4 is less than VG3. This same approach is applied to the memory cells in bins 26 and 28. To reach programmed state V2 from bin 28 will require a greater voltage applied to the gates than voltage VG1. Similarly, to reach programmed state V1 from bin 28 will require a greater voltage applied to the gates than voltage VG2. Distributions 34 and 36 each have a Vt range of about the same as the Vt range VR1, VR2, VR3, and VR4, for each of bins 26-32, respectively, and within the Vt ranging from V1min to V1max or V2min to V2max.

This approach takes advantage of the realization that after the initial programming step with cells in distribution 24 (referenced as the initial HCI state), the NVM cells all change Vt by nearly the same amount for a given programming pulse in the case of HCI programming. This is not true, however, for the erased condition. NVM cells in the erased state do not all change Vt by the same amount for a given programming pulse. Thus, the initial program step serves both to put the cells into the initial HCI state and to categorize the cells into bins based on their initial HCI Vt. Once a process for making NVM array 20 has been established, the change in Vt for a given gate voltage can be established. Thus, with the range of the current Vt known and the range of the destination Vt known, the gate voltage of the programming pulse can be selected to achieve the change from the current Vt to within the range of the destination Vt to maximize the chance that the cells in each bin will be programmed to the destination Vt with only one programming pulse. The result is that programming can be achieved for a multi-state NVM efficiently.

As an alternative to the binning shown in FIG. 3, the bins may be predetermined and the corresponding gate voltages for the programming pulses may also be predetermined. In such case, the initial programming needs to result in all of the NVM cells having a threshold voltage within the Vt range provided by the predetermined bins. If this is achieved, this would simplify the process of providing the programming pulses with the gate voltage that achieves the desired result of moving the Vt from the current Vt to the destination Vt. Each bin would have a predetermined gate voltage for each programmed state.

In the event that an NVM cell or cells do not have sufficient Vt change to reach the desired final Vt with only one HCI programming pulse, this will detected in a verification step following the programming step. If this occurs, then these under-programmed cells can be further programmed with additional pulses with the same or incremented gate voltages so as to reach the desired final Vt.

Figure 5:
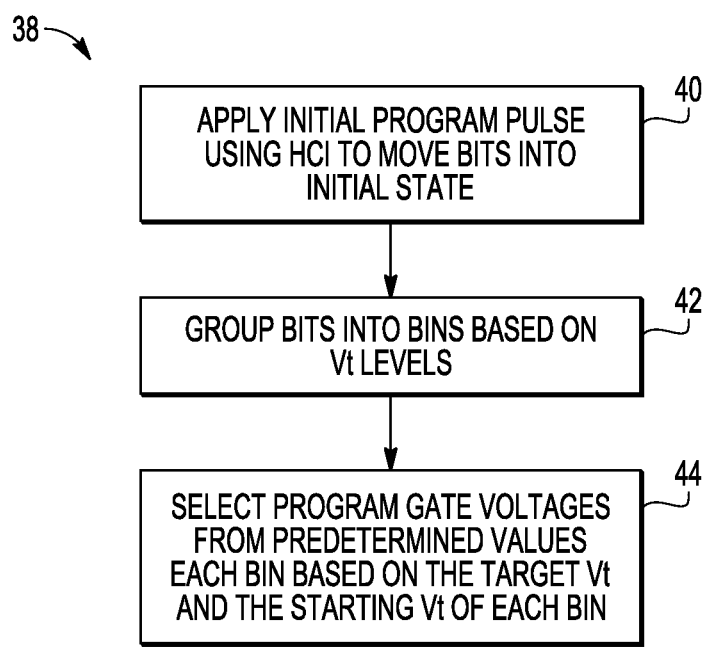
FIG. 5 is a simplified flow diagram describing an operation of the system of FIG. 1 regarding programming memory cells in the manner shown in FIGS. 2-4.

Shown in FIG. 5 is a simplified flow chart 38 for selecting the programming gate voltages for programming NVM cells to multiple programmed states. A step 40 describes applying an initial programming pulse using HCI to move NVM cells from the erased state to the initial programmed state. A step 42 describes grouping NVM cells into bins based on Vts. A step 44 describes selecting a gate voltage for a programming pulse, that may be from predetermined values, for each bin based on the target Vt and the starting Vt of each bin.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

By now it should be appreciated that there has been provided a method for programming a multi-state flash memory array having a plurality of memory cells. The method includes providing a first programming pulse to the flash memory array. The method further includes determining a threshold voltage distribution for the plurality of memory cells after providing the first programming pulse. The method further includes categorizing the plurality of memory cells into at least two bins based on a threshold voltage of each memory cell of the plurality of memory cells. The method further includes selecting a first voltage for a second programming pulse for programming a first bin of memory cells of the at least two bins, the first voltage based on both a threshold voltage of the first bin and a first target threshold voltage. The method may further comprise selecting a second voltage for a third programming pulse for programming a second bin of memory cells of the at least two bins, the second voltage based on both a threshold voltage of the second bin and on a second target threshold voltage. The method may further comprise, prior to providing the first programming pulse, erasing the plurality of memory cells using Fowler-Nordheim tunneling. The method may have a further characterization by which the first voltage is different from the second voltage. The method may have a further characterization by which the first target threshold voltage is different than second target threshold voltage. The method may have a further characterization by which categorizing the plurality of memory cells into at least two bins based on a threshold voltage further comprises categorizing the plurality of memory cells into at least two bins based on a range of threshold voltages. The method may have a further characterization by which the multi-state flash memory is further characterized as being a multi-state NOR flash memory. The method may have a further characterization by which selecting a first voltage further comprises selecting a first starting voltage for a series of programming pulses. The method may have a further characterization by which the first and second programming pulses are applied to a control gate of each memory cell of the first bin of memory cells. The method may have a further characterization by which the first and second programming pulses are further characterized as being first and second hot carrier injection programming pulses.

Also disclosed is a method for programming a multi-state flash memory having a plurality of memory cells. The method includes erasing the plurality of memory cells using Fowler-Nordheim tunneling. The method further includes providing a first hot carrier injection (HCI) programming pulse to the flash array. The method further includes determining a threshold voltage distribution for the plurality of memory cells after providing the first HCI programming pulse. The method further includes categorizing the plurality of memory cells into at least two bins based on a threshold voltage of each memory cell of the plurality of memory cells. The method further includes selecting a first voltage for a second HCI programming pulse for programming a first bin of memory cells of the at least two bins, the first voltage based on both a threshold voltage of the first bin and a first target threshold voltage. The method further includes applying the second HCI programming pulse to the first bin of memory cells. The method may have a further characterization by which applying the second HCI programming pulse further comprises applying the second HCI programming pulse to control gates of the first bin of memory cells. The method may further comprise selecting a second voltage for a third programming pulse for programming a second bin of memory cells of the at least two bins, the second voltage based on both a threshold voltage of the second bin and on a second target threshold voltage, and applying the third programming pulse to the second bin of memory cells. The method may have a further characterization by which the first voltage is different from the second voltage. The method may have a further characterization by which the first target threshold voltage is different than the second target threshold voltage. The method may have a further characterization by which selecting a first voltage further comprises selecting a first starting voltage for a series of programming pulses. The method may have a further characterization by which categorizing the plurality of memory cells into at least two bins based on a threshold voltage further comprises categorizing the plurality of memory cells into at least two bins based on a range of threshold voltages.

Disclosed also is a method for programming a multi-state NOR flash memory having a plurality of memory cells. The method includes erasing the plurality of memory cells using Fowler-Nordheim tunneling. The method further includes providing a first hot carrier injection (HCI) programming pulse to a control gate of each memory cell of the plurality of memory cells. The method further includes determining a threshold voltage distribution for the plurality of memory cells after providing the first HCI programming pulse. The method further includes categorizing the plurality of memory cells into at least two bins based on a threshold voltage of each memory cell of the plurality of memory cells. The method further includes selecting a first voltage for a second HCI programming pulse for programming a first bin of memory cells of the at least two bins, the first voltage based on both a threshold voltage of the first bin and a first target threshold voltage. The method further includes selecting a second voltage for a third HCI programming pulse for programming a second bin of memory cells of the at least two bins, the second voltage based on both a threshold voltage of the second bin and a second target threshold voltage. The method further includes applying the second HCI programming pulse to control gates of the first bin of memory cells, and applying the third HCI programming pulse to control gates of the second bin of memory cells. The method has a further characterization by which the second voltage is different than the first voltage, and wherein the first target threshold voltage is different than second target threshold voltage. The method may have a further characterization by which selecting the first voltage further comprises selecting a first starting voltage for a first series of programming pulses, and wherein selecting the second voltage further comprises selecting a second starting voltage for a second series of programming pulses. The method may have a further characterization by which categorizing the plurality of memory cells further comprises categorizing the memory cells into at least two bins, wherein each bin comprises memory cells having threshold voltages within a range of threshold voltages.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, the NVM memory was characterized as a NOR gate NVM memory but another type may benefit from the programming approach described herein. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. The term "cells", "memory cells" and "bits" are used interchangeably herein and they all refer to the memory bit cells in NVM array.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for programming a multi-state flash memory array having a plurality of memory cells, the method comprising:
providing a first programming pulse to the flash memory array;
determining a threshold voltage distribution for the plurality of memory cells after providing the first programming pulse;
categorizing the plurality of memory cells into at least two bins based on a threshold voltage of each memory cell of the plurality of memory cells;
selecting a first voltage for a second programming pulse for programming a first bin of memory cells of the at least two bins, the first voltage based on both a threshold voltage of the first bin and a first target threshold voltage; and selecting a second voltage for a third programming pulse for programming a second bin of memory cells of the at least two bins, the second voltage based on both a threshold voltage of the second bin and on a second target threshold voltage, wherein the first target threshold voltage is different from the second target voltage.

2. The method of claim 1, further comprising, prior to providing the first programming pulse, erasing the plurality of memory cells using Fowler-Nordheim tunneling.

3. The method of claim 1, wherein the first voltage is different from the second voltage.

4. The method of claim 1, wherein categorizing the plurality of memory cells into at least two bins based on a threshold voltage further comprises categorizing the plurality of memory cells into at least two bins based on a range of threshold voltages.

5. The method of claim 1, wherein the multi-state flash memory is further characterized as being a multi-state NOR flash memory.

6. The method of claim 1, wherein selecting a first voltage further comprises selecting a first starting voltage for a series of programming pulses.

7. The method of claim 1, wherein the first and second programming pulses are applied to a control gate of each memory cell of the first bin of memory cells.

8. The method of claim 1, wherein the first and second programming pulses are further characterized as being first and second hot carrier injection programming pulses.

9. A method for programming a multi-state flash memory having a plurality of memory cells, the method comprising:

erasing the plurality of memory cells using Fowler-Nordheim tunneling;

providing a first hot carrier injection (HCI) programming pulse to the flash array;

determining a threshold voltage distribution for the plurality of memory cells after providing the first HCI programming pulse;

categorizing the plurality of memory cells into at least two bins based on a threshold voltage of each memory cell of the plurality of memory cells;

selecting a first voltage for a second HCI programming pulse for programming a first bin of memory cells of the at least two bins, the first voltage based on both a threshold voltage of the first bin and a first target threshold voltage;

applying the second HCI programming pulse to the first bin of memory cells;

selecting a second voltage for a third programming pulse for programming a second bin of memory cells of the at least two bins, the second voltage based on both a threshold voltage of the second bin and on a second target threshold voltage, wherein the first target threshold voltage is different than the second target threshold voltage; and applying the third programming pulse to the second bin of memory cells.

10. The method of claim 9, wherein applying the second HCI programming pulse further comprises applying the second HCI programming pulse to control gates of the first bin of memory cells.

11. The method of claim 9, wherein the first voltage is different from the second voltage.

12. The method of claim 9, wherein selecting a first voltage further comprises selecting a first starting voltage for a series of programming pulses.

13. The method of claim 9, wherein categorizing the plurality of memory cells into at least two bins based on a threshold voltage further comprises categorizing the plurality of memory cells into at least two bins based on a range of threshold voltages.

14. A method for programming a multi-state NOR flash memory having a plurality of memory cells, the method comprising:

erasing the plurality of memory cells using Fowler-Nordheim tunneling;

providing a first hot carrier injection (HCI) programming pulse to a control gate of each memory cell of the plurality of memory cells;

determining a threshold voltage distribution for the plurality of memory cells after providing the first HCI programming pulse;

categorizing the plurality of memory cells into at least two bins based on a threshold voltage of each memory cell of the plurality of memory cells;

selecting a first voltage for a second HCI programming pulse for programming a first bin of memory cells of the at least two bins, the first voltage based on both a threshold voltage of the first bin and a first target threshold voltage;

selecting a second voltage for a third HCI programming pulse for programming a second bin of memory cells of the at least two bins, the second voltage based on both a threshold voltage of the second bin and a second target threshold voltage; and applying the second HCI programming pulse to control gates of the first bin of memory cells, and applying the third HCI programming pulse to control gates of the second bin of memory cells, wherein the second voltage is different than the first voltage, and wherein the first target threshold voltage is different than second target threshold voltage.

15. The method of claim 14, wherein selecting the first voltage further comprises selecting a first starting voltage for a first series of programming pulses, and wherein selecting the second voltage further comprises selecting a second starting voltage for a second series of programming pulses.

16. The method of claim 14, wherein categorizing the plurality of memory cells further comprises categorizing the memory cells into at least two bins, wherein each bin comprises memory cells having threshold voltages within a range of threshold voltages.

* * * * *